(12) United States Patent
Kreifeldt et al.

(10) Patent No.: US 9,900,689 B2
(45) Date of Patent: Feb. 20, 2018

(54) ADAPTIVE DETECTOR AND AUTO MODE FOR DYNAMICS PROCESSOR

(71) Applicant: HARMAN INTERNATIONAL INDUSTRIES, INC., Stamford, CT (US)

(72) Inventors: Richard A. Kreifeldt, South Jordan, UT (US); Ajay Iyer, Murray, UT (US)

(73) Assignee: Harman International Industries Incorporated, Stamford, CT (US)

( * ) Notice: Subject to any disclaimer, the term of this patent is extended or adjusted under 35 U.S.C. 154(b) by 628 days.

(21) Appl. No.: 14/318,834

(22) Filed: Jun. 30, 2014

(65) Prior Publication Data

US 2015/0382107 A1 Dec. 31, 2015

(51) Int. Cl.
*H04R 3/00* (2006.01)
*G10K 11/16* (2006.01)
*H03G 7/00* (2006.01)

(52) U.S. Cl.
CPC ............ *H04R 3/007* (2013.01); *G10K 11/16* (2013.01); *H03G 7/002* (2013.01); *H03G 7/007* (2013.01)

(58) Field of Classification Search
CPC .................................................... H04R 3/007
USPC .................. 381/17, 71.11, 72; 375/229, 232
See application file for complete search history.

(56) References Cited

U.S. PATENT DOCUMENTS

| | | | |
|---|---|---|---|
| 4,377,792 A | 3/1983 | Blackmer et al. | |
| 5,434,922 A | 7/1995 | Thomas | |
| 5,550,923 A * | 8/1996 | Hotvet | H04R 1/1083 381/72 |
| 5,841,810 A * | 11/1998 | Wong | H04B 3/145 375/232 |
| 7,668,236 B2 * | 2/2010 | Lee | H04L 25/03885 375/229 |
| 7,848,531 B1 | 12/2010 | Vickers et al. | |
| 2011/0295919 A1 | 12/2011 | Massenburg | |

FOREIGN PATENT DOCUMENTS

| | | |
|---|---|---|
| EP | 2009786 A1 | 12/2008 |
| EP | 2369852 A1 | 9/2011 |
| EP | 2469708 A1 | 6/2012 |
| WO | 9319525 A1 | 9/1993 |

OTHER PUBLICATIONS

Wolfgang Klippel; Nonlinear Adaptive Controller for Loudspeakers With Current Sensor; An Audio Engineering Society Preprint presented at the 106th Convention; Munich, Germany; May 8-11, 1999; pp. 1-18.
Partial European Search Report in corresponding European application EP 15174264.0 dated Jan. 12, 2016, 6 pages.
Extended European Search Report in corresponding European application EP 15174264.0 dated May 31, 2016, 12 pages.

* cited by examiner

*Primary Examiner* — Md S Elahee
(74) *Attorney, Agent, or Firm* — Brooks Kushman, P.C.

(57) ABSTRACT

A dynamic processor for compressing an incoming audio signal is provided. The processor includes an adaptive detector, an adaptive module, and an amplifier. The adaptive detector includes a first adaptive filter and is configured to apply a transfer function to the incoming audio signal to generate a detector output signal. The adaptive module includes a second adaptive filter and is configured to generate a control signal based on the detector output signal. The amplifier is configured to receive the control signal from the adaptive module and to generate a compressed audio signal based on the control signal.

10 Claims, 3 Drawing Sheets

US 9,900,689 B2

ADAPTIVE DETECTOR AND AUTO MODE FOR DYNAMICS PROCESSOR

TECHNICAL FIELD

Aspects disclosed herein generally relate to an apparatus for an adaptive detector and an auto mode for a dynamics processor.

BACKGROUND

Loud and impulsive sounds, especially gunshots, when played through a digital sound reproduction chain, can cause damage to loudspeakers, as well as be dangerous to the human ear. Dynamic processors are often used to reduce the dynamic range of loud, incoming audio signals in order to limit these dangers. These processors may compress loud incoming sounds or an input signal level by reducing sounds that are above a set threshold. In this type of compression, an output signal level is typically constrained to a constant value whenever an amplitude of the input signal level exceeds the set threshold. However, dynamic processors aim to have fast response time. Often, when a fast response time is achieved, the dynamic processor may generate outputs that are dependent on a frequency of the incoming audio signal. Such a frequency dependency may result in an incorrect output and may thus result in incorrectly limiting the audio signal. If the frequency dependency is reduced, the response time is often increased. Without fast response times, the dynamic processor may not be effective. This may result in a signal output that may cause speaker or hearing damage. Accordingly, an effective dynamic processor may have fast response times without being dependent on the frequency. Traditional methods that simply adapt portions of dynamic processor minimize the effect, however they are neither fast enough to be effective on impulsive noises such as gunshots nor slow enough to remove all frequency-dependent errors in output level.

SUMMARY

A fully adaptive dynamic processor for compressing an incoming audio signal may include an adaptive detector including a first adaptive filter and configured to apply a transfer function to the incoming audio signal to generate a detector output signal, an adaptive module including a second adaptive filter and configured to generate a control signal based on the detector output signal and an amplifier configured to receive the control signal from the adaptive module and to generate a compressed audio signal based on the control signal.

An adaptive detector of a dynamic processor for compressing an incoming audio signal may include an adaptive filter configured to apply a transfer function to the incoming audio signal to generate an output signal, a log function configured to execute a logarithm of the output signal and to generate a resultant log function output, and a fixed filter configured to filter the resultant log function output.

A method for processing an incoming audio signal may include applying a first adaptive filter to an incoming audio signal, applying a log function to an output of the first adaptive filter, applying a fixed filter to an output of the log function, determining an instantaneous control voltage based on an output of the fixed filter and dynamics processor threshold, and applying a second adaptive filter to the instantaneous control voltage.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompanying drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Described herein is a dynamic processor having an adaptive detector and an adaptive module. The adaptive detector may be capable of having fast response times while concurrently providing uniform non-frequency dependent limiting. This may be achieved, at least in part, by including both an adaptive filter and a fixed filter within the adaptive detector. The fixed filter may be configured to receive a detector output signal from the adaptive filter after a logarithmic function. The adaptive module may then receive the detector output signal from the adaptive detector to generate a control voltage for a voltage controlled amplifier. The instantaneous control voltage may be generated based on the detected output signal and a threshold. The adaptive module may apply a filter logic to create the smoothed control voltage. The filter logic may be selected based on the instantaneous control voltage of the detected output signal in relation to the threshold. For example, an attack, release or a hysteresis filter may be applied based on whether if the instantaneous control voltage is above, below or within a certain threshold.

The adaptive module may include an adaptive filter that includes varying time constants. The adaptive module may further increase or decrease the response time by adapting the time constants of the adaptive filters simultaneously with the time constant of the adaptive detector. This may be done using an 'auto mode' that automatically modifies the time constants. By using an adaptive filter in both the adaptive detector and adaptive module, compression of the incoming audio signal may be achieved with very fast response times as well as with uniform, non-frequency dependent limiting. Moreover, by automatically modifying the time constants of the attack and release logic within the adaptive module as a function of the time constants of the adaptive detector, maximum speed may be achieved while limiting distortion of the compressed signal.

Figure 1:
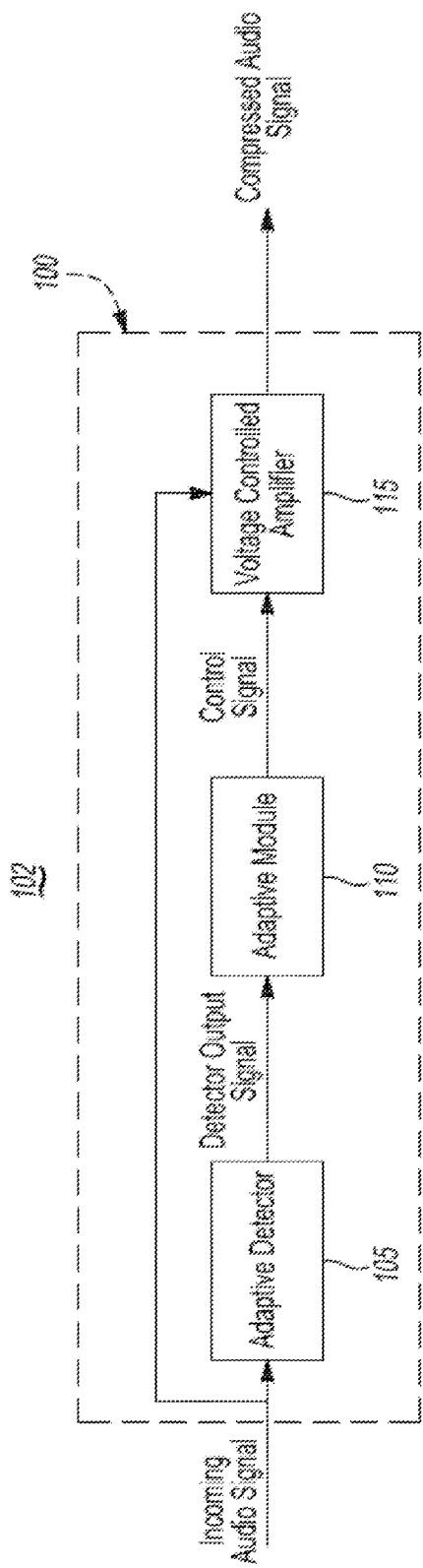
FIG. 1 is an exemplary block diagram for a dynamic processor.

FIG. 1 is an exemplary block diagram for a dynamics processor 102. The dynamics processor 102 may be any type of dynamics processor and may alter an audio signal based upon the signal's frequency and amplitude. The dynamics processor 102 may perform as a compressor, limiter, gate and/or expander. A limiter 100 of the dynamics processor 102 may include an adaptive detector 105, an adaptive module 110 and an adaptive voltage controlled amplifier (or VCA) 115. The limiter 100 may allow signals with certain power levels to pass while attenuating the peaks of stronger signals. Although the example in FIG. 1 includes a limiter, the dynamics processor 102 may additionally or alternatively include a gate (not shown). The gate may attenuate sounds below a threshold power level while letting signals with higher power levels to pass.

The adaptive detector 105 may receive an incoming (or original) audio signal. The incoming audio signal may represent audio, including loud or impulsive sounds such as gunshots, drum sounds, etc. These loud sounds may be dangerous to the human ear and may also damage equipment such as loudspeakers. The limiter 100 may compress the incoming audio signal in order to reduce the loud audio. The adaptive detector 105 and the adaptive module 110 may generate a control signal based on the incoming audio signal and provide the voltage controlled amplifier 115 with the control signal. The voltage controlled amplifier 115 may then generate a compressed audio signal using the control signal and the audio signal. The gain of the voltage controlled amplifier 115 may be set by the voltage of the control signal. The compressed audio signal may then be provided to a monitor or speaker for playback. Thus, the voltage controlled amplifier 115, using a control voltage as defined by the control signal, may reduce the dynamic range (i.e., loudness) of the incoming audio signal and provide for a tolerable and refined listening experience.

Figure 2:
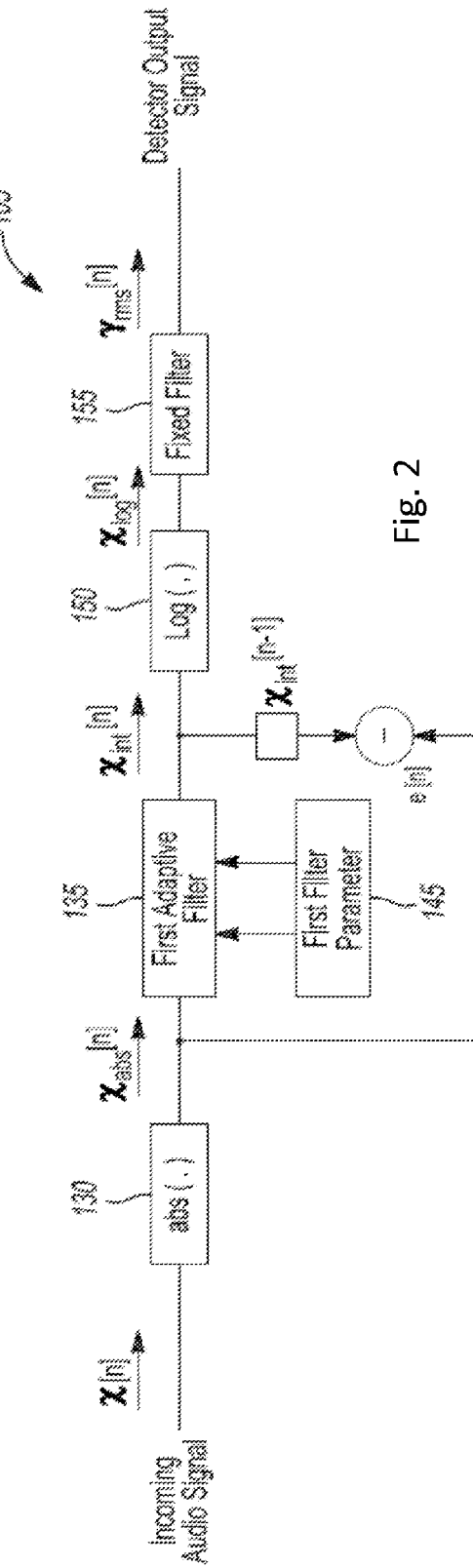
FIG. 2 is an exemplary schematic for the adaptive detector of the processor of FIG. 1.

FIG. 2 is an exemplary schematic for the adaptive detector 105 as set forth in FIG. 1. The adaptive detector 105 may determine an average signal level, process the incoming audio signal and provide a detector output signal to the adaptive module 110. The adaptive detector 105 may be a log-domain root-mean-square (RMS) detector. Advantages to using an RMS detector as opposed to a peak detector may be realized, including reducing the dynamic range (e.g., the difference between a lowest noise level and a highest noise level) regardless of peak values, being used in multiband compression, among others.

The adaptive detector 105 may include a first absolute function 130, a first adaptive filter 135, a first filter parameter block 145, a logarithmic function 150 (or log function) and a fixed filter 155. The first absolute function 130 may be applied to the incoming audio signal to determine a first absolute voltage of the incoming audio signal. This may also be referred to as target value $x_{abs}[n]$. The first adaptive filter 135 may be a resistor-capacitor (RC) filter or circuit. Once the first absolute voltage has been determined, the first adaptive filter 135 may process the incoming audio signal. The first adaptive filter 135 may be a lowpass filter configured to smooth the incoming audio signal by applying a transfer function. Such a transfer function may be adjusted by the first adaptive filter 135 based on the previous output of the detector and the first absolute value of the incoming audio signal. The first adaptive filter 135 may have a faster response time than the response time of the fixed filter 155. The first adaptive filter 135 may thus track large changes in the incoming audio signal quickly and track small changes in the incoming audio signal slowly.

In applying the transfer function at the first adaptive filter 135, the first adaptive filter 135 may limit the frequencies of the incoming audio signal to create a smoothed audio signal.

A low pass filter may be applied to the incoming audio signal in order to estimate the RMS value of the signal. The first adaptive filter 135 may be applied using various filter parameters from the first filter parameter block 145. The filter parameters may include first time constants for the first adaptive filter 135. These first time constants may be adaptively updated based on an error signal e[n] and the target value $x_{abs}[n]$. The first time constants may be determined based on a change in the RMS value. Additionally or alternatively, the first adaptive filter 135 may be viewed as a lowpass filter with a gain of $\alpha_{int}[n]$ and a pole at $\beta_{int}[n] = 1 - \alpha_{int}[n]$.

The output of the first adaptive filter 135, represented by $x_{int}[n]$ in FIG. 2, may be determined by the equations below:

$$x_{int}[n] = \alpha_{int}[n] * x_{abs}[n] + \beta_{int}[n] * x_{int}[n-1];$$

where:

$$\beta_{int}[n] = 1 - \alpha_{int}[n];$$

and where $x_{int}[n-1]$ is calculated based on a delay element, where the value of $\alpha_{int}[n]$ is adaptively updated within the first filter parameter block 145, using:

$$\alpha_{int}[n] = \max(\alpha_{0,thresh}, \alpha_{0,int} \alpha k_{int} |e[n]|);$$

where, $[n] = x_{abs}[n] - x_{int}[n-1]$ and $0 \leq \alpha_{0,int} \leq 1$ and $0 \leq k_{int} \leq 1$; and where, $\alpha_{0,thresh}$ determines the slowest speed of the adaptive detector. That is, $\alpha_{0,thresh}$, represents the smallest possible value of $\alpha_{int}[n]$. Further, $\alpha_{0,int} + k_{int}|e[n]|$ represents a value that varies linearly with the error $|e[n]|$. $\alpha_{0,int}$ is the constant term i.e., the value at $|e[n]| = 0$ and $k_{int}$ is the slope. The terms determine a threshold for the error below which the filter acts as a fixed filter and above which the filter acts as an adaptive filter. This threshold for the error ($e_{thresh}[n]$) is determined by setting:

$$\alpha_{0,thresh} = \alpha_{0,int} + k_{int}|e_{thresh}[n]|$$

Thus, $$|e_{thresh}[n]| = \frac{\alpha_{0,thresh} - \alpha_{0,int}}{k_{int}}$$

The absolute value of the error ($|e[n]|$) is used to ensure symmetric behavior for an increase/decrease in the input signal. Asymmetric behavior may be represented by using different constants depending on whether the error is positive or negative. Accordingly, $\alpha_{0,thresh}, \alpha_{0,int}$ and $k_{int}$ are used to tune the performance/speed of the first adaptive filter 135. Thus, given $\alpha$, $\beta$ may be determined. A fast response time at the first adaptive filter 135 may be achieved by using large values for $\alpha_{0,thresh}$, $\alpha_{0,int}$, and $k_{int}$. These values may be adjusted to obtain an estimate of the peak value of the signal instead of the instantaneous RMS value. Because of this, the limiter 100 may be able to switch between a peak limiter and an RMS limiter.

The output of the first adaptive filter 135 (e.g., $x_{int}[n]$), may be transmitted to the logarithmic function 150 and the logarithmic function 150 may take the logarithm of the output of the first adaptive filter 135. The resultant value, referred to as $x_{log}[n]$, may be transmitted to the fixed filter 155. The fixed filter 155 may be a non-adaptive, or static, filter configured to apply a static, non-adaptive, transfer function to further smooth the audio signal (e.g., the detector output signal.) Using a log-domain function for processing the output of the first adaptive filter 135 may reduce multiplications and divisions to signal. When the signal is converted from the linear-domain to the log-domain, the dynamic range of the input signal may be increased. Because the adaptive filter 135 responds quickly to large changes in a signal, the log function 150 may be placed after the first adaptive filter 135. Placing a log function prior to the filter may result in a signal with greater variances (i.e. a less smooth signal). Thus, more smoothing with faster time constants may be achieved by applying the first adaptive filter 135 in the linear domain prior to the log function 150.

Further, the first adaptive filter 135 and fixed filter 155 may have exponential rise times. By applying the fixed filter 155 after the log function 150, the rise time of the fixed filter 155 is in the log-domain, which is significantly faster than if it were in the linear-domain. Because the first adaptive filter 135 has smoothed most of the transients in the signal, the fixed filter 155 does not necessarily need to further smooth the signal.

Thus, the first adaptive filter 135 and the fixed filter 155, or static filter, are included in the adaptive detector 105 to process an incoming audio signal. By placing the first adaptive filter 135 before the logarithmic function 150, the amplitude of the frequency dependent variations in the detector output signal are decreased. By placing the fixed filter 155 after the logarithmic function 150, additional smoothing of the dependent variations may be achieved. The adaptive detector 105 is capable of having fast response times while providing uniform non-frequency dependent limiting. Further, the first adaptive filter 135 may permit an iterative approach to signal compression. For example, where the error e[n] is large, a is large, and $x_{int}[n]$ will make large increments to reach the target value. As the value of a decreases, smaller increments may be used to achieve the target value. Further, if the error e[n] is very small, a does not change with time and is therefore constant. In this situation, the first adaptive filter 135 acts as a static RC filter based on the provided first filter parameters.

As described above, a low pass filter may be applied to the incoming audio signal in order to estimate the RMS value of the signal. Further, the filter parameters may include time constants. These time constants may be determined based on a rate of change of an RMS value of the incoming audio signal. In one example, as the rate of change of the RMS values increase, so does the respective response time, or time constant. Similarly, time constants may decrease as the rate of change of the RMS value decreases. The second time constants of the second adaptive filter parameters may be a function of the time constants of the first adaptive filter parameters.

Figure 3:
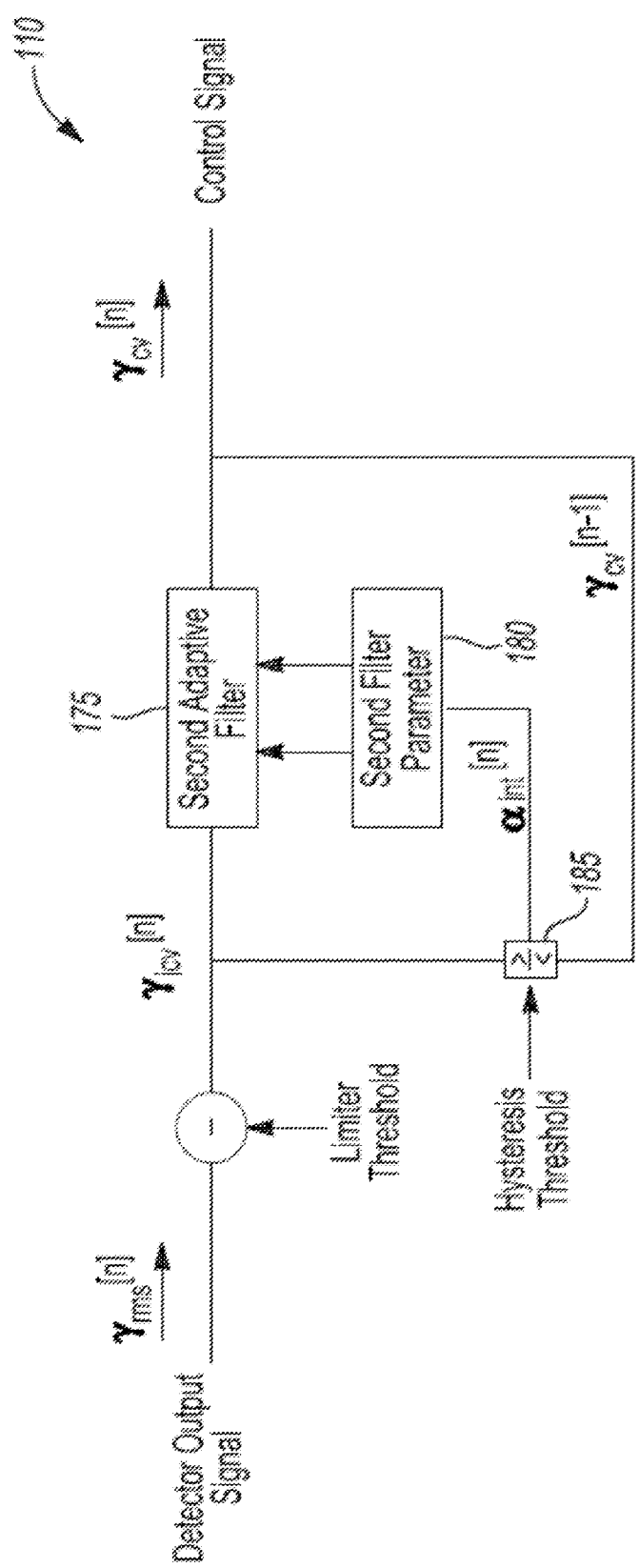
FIG. 3 is an exemplary schematic for the adaptive module of FIG. 1.

Referring now to FIG. 3, an exemplary schematic for the adaptive module 110 is illustrated. The adaptive module 110 receives the detector output signal, as represented by $y_{rms}[n]$ in FIGS. 2 and 3. Generally, the adaptive module 110 processes the detector output signal from the adaptive detector 105 to avoid large instantaneous changes to the control voltage. This may be accomplished when the adaptive module 110 functions in an automatic mode, where the adaptive module 110 automatically sets or provides certain time constants. The time constants may be based on the value of $\alpha_{0,int}$, as described above.

The adaptive module 110 may include a second adaptive filter 175, a second filter parameter block 180, and a hysteresis decision block 185.

After the instantaneous RMS value has been determined, an instantaneous control voltage may be calculated by applying a limiter threshold to the instantaneous RMS value. The instantaneous control voltage is represented by $y_{icv}[n]$ in FIG. 3. The instantaneous control voltage is the difference between the instantaneous RMS voltage of the signal and the limiter threshold. The limiter threshold determines the maximum output Sound Pressure Level (SPL) of the system. This maximum SPL is directly proportional to the limiter threshold. The maximum SPL depends on the application and the environment the technology might be used in and may be adjusted accordingly. The limiter 100 threshold establishes a maximum threshold for the instantaneous RMS voltage to ensure that the maximum SPL of the system output is not exceeded. A hysteresis threshold at the hysteresis decision block 185 may act on the difference between $y_{rms}[n]$ and the limiter threshold. It essentially maybe a range around the limiter threshold.

The second adaptive filter 175 may receive the instantaneous control voltage. The second adaptive filter 175 may be an RC filter circuit. The second adaptive filter 175 may be configured to smooth the detector output signal. The second adaptive filter 175 may use the instantaneous control voltage to adjust a transfer function thereof. The second adaptive filter 175 may apply the transfer function and generate a smoothed control signal, represented by $y_{cv}[n]$. In general, the smoothed control signal may be generated, at least in part, based on hysteresis logic at the hysteresis decision block 185 and on second filter parameters supplied by the second filter parameter block 180. The second filter parameters may include time constants for the second adaptive filter 175. These second time constants may be adaptively updated based on the hysteresis thresholds and the value of $\alpha_{int}[n]$. As explained herein, the second time constants may be a function of the first time constants.

As noted above, the hysteresis decision block 185 may determine which type of logic (e.g., attack, release and hysteresis logic) may be used by the second adaptive filter 175. When implementing the attack logic, the limiter 100 decreases the amplitude of the incoming audio signal. When implementing the release logic, the limiter 100 may pass the audio signal un-attenuated. The value of the attenuation may be established by the auto mode. When implementing the hysteresis logic, the voltage controlled amplifier 115 may be prevented from responding to minor fluctuations in the control voltage. That is, if only a minor fluctuation in the signal strength is detected, hysteresis logic with a fixed time variable may be selected. The filter logic may also determine the speed with which the limiter 100 may change the amplitude. In one example, if the second filter parameters include time constants 10 dB per 1 ms, then it may take 1 ms for the gain to decrease by 10 dB The determination of which type of filter/logic to apply at the second adaptive filter 175 may be based on the instantaneous control voltage and the predefined hysteresis thresholds. The thresholds may include an upper threshold (+H) and a lower threshold (−H). The thresholds are set so as to reduce the transients in the control signal from the adaptive module 110. The hysteresis decision block 185 may compare these thresholds to the instantaneous control voltage to determine which logic to apply at the second adaptive filter 175.

In one example, if the instantaneous control voltage is greater than the upper threshold (i.e., $y_{icv}[n]>+H$), then the attack logic is selected. If the attack logic is selected, the time constants are defined as:

$$\alpha_{attack}[n]=\max(\alpha_{attack,thresh},\alpha_{0,attack}+k_{attack}\alpha_{int}[n]);$$

$$\beta_{attack}[n]=1-\alpha_{attack}[n];$$

where $0\leq\alpha_{0,attack},\alpha_{attack,thresh}\leq1$ and $0\leq k_{attack}\leq1$; and where $\alpha_{attack,thresh},\alpha_{0,attack}$, and $k_{attack}$ have similar behavior to the parameters $\alpha_{0,thresh}$, $\alpha_{0,int}$, and $k_{int}$. However, each of the terms $\alpha_{attack,thresh},\alpha_{0,attack}$, and $k_{attack}$ determine a threshold for the value of $\alpha_{int}[n]$, above which the filter acts as an adaptive filter and below which the filter acts as an fixed filter.

In the above situation, where the instantaneous control voltage (e.g., $y_{icv}[n]$) exceeds the hysteresis threshold, the signal may require attenuation. Application of the attack logic via the second adaptive filter 175 may determine the amount of attenuation to be applied. The attenuation may be applied by the VCA 115 to the original/input audio signal. The amount of attenuation is determined by the attack logic at the adaptive filter.

If the instantaneous control voltage is within the upper and lower thresholds (i.e. $-H<y_{icv}[n]<+H$), then the hysteresis logic is selected. If the hysteresis logic is selected, the time constants are fixed and time invariant. In this example, the second adaptive filter 175 functions as a static filter.

If the instantaneous control voltage is below the lower threshold (i.e. $y_{icv}[n]<-H$), then the release logic is selected. If the release logic is selected, the time constants are defined as:

$$\alpha_{release}[n]=\max(\alpha_{release,thresh}, \alpha_{0,release}+k_{release}\alpha_{int}[n]);$$

$$\beta_{release}[n]=1-\alpha_{release}[n];$$

where $0 \leq \alpha_{0,release}, \alpha_{release,thresh} \leq 1$ and $0 \leq k_{release} \leq 1$.

When the instantaneous control voltage is not above the hysteresis threshold, attenuation is not required.

Thus, the adaptive module 110 may apply an auto mode to determine, based on the instantaneous RMS voltage, whether to pass the control signal through to the voltage controlled amplifier 115 or to attenuate it. The adaptive module may also determine the amount of attenuation to be applied. Further, the adaptive module 110 may determine the speed with which to track a change in the instantaneous RMS voltage by using a hysteresis logic to prevent the voltage controlled amplifier 115 from responding to minor fluctuations in the control voltage. Once the control voltage is determined and the hysteresis logic is applied, the adaptive module 110 may generate a control signal (i.e., a smoothed control signal with a smoothed control voltage) for output to the voltage controlled amplifier 115.

Figure 4:
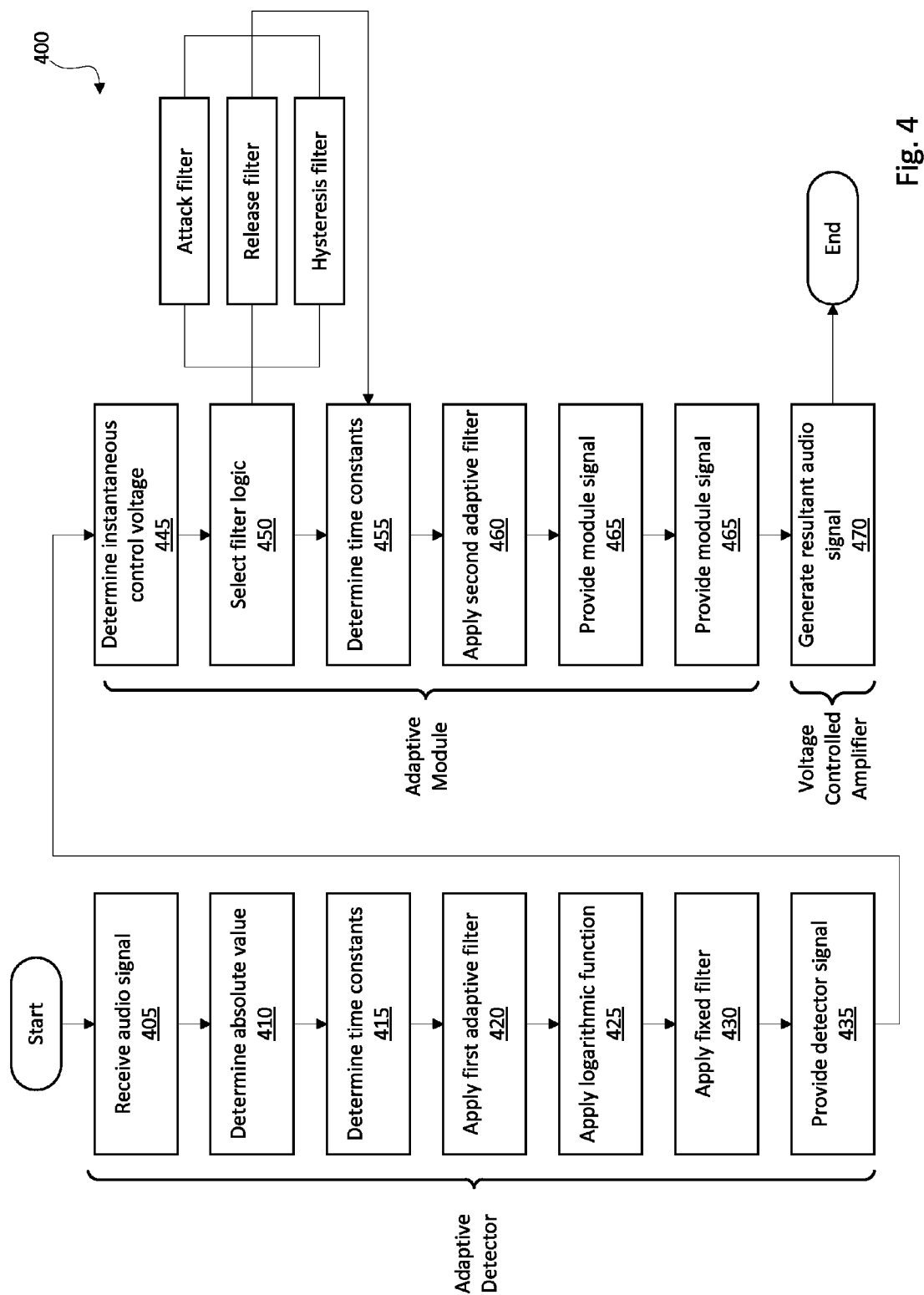
FIG. 4 is a flow chart for computing an output voltage at the processor of FIG. 1.

FIG. 4 is an exemplary flow chart for generating a compressed audio signal at the limiter 100 of FIG. 1. The process may begin at block 405 where the limiter 100 may receive an incoming audio signal. As explained, the incoming audio signal may represent audio sounds, including loud or impulsive sounds that require compression.

At block 410, the adaptive detector 105 may determine the first absolute voltage of the audio signal. The first absolute voltage is referenced in the figures and within as $x_{abs}[n]$. The first absolute voltage may be determined by the first absolute function 130 within the adaptive detector 105.

At block 415, the adaptive detector 105 may determine the first filter parameters at the first filter parameter block 145. The filter parameters may include time constants that are adaptively updated based on an error signal e[n].

At block 420, the first adaptive filter 135 may be applied to the incoming audio signal using the first filter parameters. At block 425, the limiter 100 may apply a logarithmic function 150 to the output of the first adaptive filter 135.

At block 430, the adaptive detector 105 may further smooth the output of the logarithmic function 150 at the fixed filter 155 and generate a detector output signal.

At block 435, the adaptive detector 105 may provide the detector output signal to the adaptive module 110.

At block 445, the adaptive module 110 may determine the instantaneous control voltage, represented by $y_{icv}[n]$ in FIG. 3, by taking the difference between the detector output signal and the limiter threshold.

At block 450, the adaptive module 110 may select a filter logic to be applied by the second adaptive filter 175. As explained above, this selection may be based on the instantaneous control voltage and the predefined hysteresis thresholds. The filter logic may include an auto mode to select the attack, release and hysteresis logic (attack, release and hysteresis filters).

At block 455, the adaptive module 110 may determine the second filter parameters at the second filter parameter block 180. As explained above, the second filter parameters may include second time constants for the second adaptive filter 175 and may be adaptively updated based on the selected filter logic.

At block 460, the adaptive module 110 may apply the second adaptive filter 175 to detector output signal using the second filter parameters and the selected filter logic.

At block 465, the adaptive module 110 may provide the control signal to the voltage controlled amplifier 115.

At block 470, the voltage controlled amplifier 115 may generate the compressed audio signal based on the smoothed control voltage of the control signal and the original/input audio signal. The process may then end.

Computing devices described herein generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A dynamic processor for processing an incoming audio signal, the processor comprising:
   an adaptive detector including a first adaptive filter and configured to apply a transfer function to the incoming audio signal to generate a detector output signal;

an adaptive module including a second adaptive filter and configured to generate a control signal based on the detector output signal; and an amplifier configured to receive the control signal from the adaptive module and to generate a processed audio signal based on the control signal.

2. The processor of claim 1, wherein the adaptive detector includes a first fixed filter configured to filter the incoming audio signal.

3. The processor of claim 2, wherein the adaptive detector includes a logarithmic function configured to be applied after the incoming audio signal is filtered by the first adaptive filter and before processing by the first fixed filter.

4. The processor of claim 2, wherein the adaptive detector is configured to change a response time based on the change in level of the incoming audio signal.

5. The processor of claim 4, wherein the adaptive module is further configured to adapt its response time based on the response time of the adaptive detector.

6. The processor of claim 1, wherein the adaptive module is further configured to select a filter logic to be applied by the second adaptive filter based on an instantaneous control voltage of the detector output signal and a predefined threshold, wherein the threshold includes an upper threshold and a lower threshold.

7. The processor of claim 6, wherein the filter logic is one of an attack filter, a release filter and a hysteresis filter.

8. The processor of claim 7, wherein the adaptive module is further configured to select the attack filter in response to the detector output signal being greater than an upper threshold.

9. The processor of claim 7, wherein the adaptive module is further configured to select the release filter in response to the detector output signal being less than the lower threshold.

10. The processor of claim 6, wherein the adaptive module is further configured to select the hysteresis filter in response to the instantaneous control voltage being less than the upper threshold and greater than the lower threshold.

* * * * *